(12) United States Patent  (10) Patent No.: US 6,986,851 B2
Kitamura et al.  (45) Date of Patent: Jan. 17, 2006

(54) DRY DEVELOPING METHOD

(75) Inventors: Akinori Kitamura, Yamanashi (JP); Vaidya Nathan Balasubramaniam, Beverly, MA (US); Koichiro Inazawa, Yamanashi (JP); Masaru Nishino, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/486,828

(22) PCT Filed: Aug. 13, 2002

(86) PCT No.: PCT/JP02/08242

§ 371 (c)(1), (2), (4) Date: Feb. 20, 2004

(87) PCT Pub. No.: WO03/017343

PCT Pub. Date: Feb. 27, 2003

(65) Prior Publication Data

US 2004/0169009 A1    Sep. 2, 2004

(30) Foreign Application Priority Data

Aug. 20, 2001 (JP) ............................. 2001-249233

(51) Int. Cl.
*B44C 1/22*    (2006.01)
*C03C 15/00*   (2006.01)

(52) U.S. Cl. .................... 216/47; 216/41; 216/67; 430/296; 430/313

(58) Field of Classification Search ............. 216/41, 216/47, 67; 430/296, 313; 438/694
See application file for complete search history.

(56) References Cited

U.S. PATENT DOCUMENTS

| | | | | |
|---|---|---|---|---|
| 4,968,583 A | * | 11/1990 | Ohshio et al. | 430/296 |
| 5,160,404 A | * | 11/1992 | Motoyama | 438/694 |
| 6,039,888 A | | 3/2000 | Ha et al. | |
| 6,136,511 A | * | 10/2000 | Reinberg et al. | 430/313 |

FOREIGN PATENT DOCUMENTS

| | | |
|---|---|---|
| JP | 59-169137 | 9/1984 |
| JP | 62-94933 | 5/1987 |
| JP | 1-206624 | 8/1989 |
| JP | 7-135140 | 5/1995 |
| JP | 10-268526 | 10/1998 |

* cited by examiner

*Primary Examiner*—Shamim Ahmed
(74) *Attorney, Agent, or Firm*—Oblon, Spivak, McClelland, Maier & Neustadt, P.C.

(57) ABSTRACT

A dry developing method for drawing a resist formed on a processed body by leading processing gas between parallel flat electrodes installed in a vacuum processing container and forming the plasma of the processing gas by applying a high frequency power to the electrodes, comprising the step of plasma-processing the resist on an etched layer having an already developed upper layer resist containing silicon and a lower layer resist installed in contact with the lower layer of the upper layer resist, wherein the lower layer resist is processed by a first process for plasma-processing by using the mixed gas of carbon monoxide gas and oxygen gas and a second step for plasma-processing by using the mixed gas of nitrogen gas and hydrogen gas, whereby an accurate drawing can be applied efficiently to the resist.

13 Claims, 3 Drawing Sheets

DRY DEVELOPING METHOD

FIELD OF THE INVENTION

The present invention relates to a dry developing method; and, more particularly, to a dry developing method capable of etching a lower layer resist of a double-layer resist without destroying an upper layer resist thereof, while maintaining a vertical sidewall of a pattern being etched.

BACKGROUND OF THE INVENTION

In a recent trend of high integration of semiconductor devices, design rule is becoming stricter. Accordingly, a lithography process performed during a manufacturing process requires a high degree of accuracy.

For this reason, a resist used in the lithography process includes a resist layer subject to a wet developing process (hereinafter, referred to as "lower layer resist") provided beneath a wet-developed resist layer (hereinafter, referred to as "upper layer resist"), for example. Such resist structure enables a high density patterning, despite, if any, a stepped portion in an etching layer therebelow.

However, in order to maintain the accuracy when the lower layer resist of the double-layer structure resist is dry-developed, the lower layer resist needs to be sufficiently etched without destroying the upper layer resist by etching. Additionally, it is crucial that sidewalls of a pattern formed in the lower layer resist are vertically formed in a designed dimensions in order to improve an accuracy of machining.

FIG. 4 is a schematic crosssectional view of a processing object 10 developed by using a conventional method. FIG. 4A shows a case where a reactive ion etching is performed by using, e.g., an oxygen gas, whereas FIG. 4B illustrates a case where an etching is carried out by using a gaseous mixture of, e.g., a nitrogen gas and a hydrogen gas. Herein, the processing object 10 includes an upper layer resist 16 forming a top surface thereof, a lower layer resist 14 formed under the upper layer resist 16 and an etching layer 12 formed beneath the lower layer resist 14.

Since, however, the etching by using the oxygen gas is isotropically performed with minimal anisotropy, and thus, an erosion phenomenon, e.g., an undercut or a bowing, occurs at the sidewall of the pattern in the lower layer resist 14, as illustrated in FIG. 4A.

To that end, there is provided a method of low power etching to avoid the erosion phenomenon described above. However, such low power etching method suffers from drawbacks of reduced etching rateand deteriorated efficiency.

On the other hand, by using the gaseous mixture of nitrogen gas and hydrogen gas in etching, the undercutting of the sidewall or the like can be avoided. Since, however, an etching selectivity between the lower layer resist 14 and the upper layer resist 16 is small, when using such gaseous mixture in performing etching, a pattern formed in the upper layer resist 16 is damaged, thereby deteriorating the machining accuracy of the lower layer resist 14 as well as the etching accuracy of the etching layer 12 formed beneath the lower layer resist 14.

SUMMARY OF THE INVENTION

The present invention has been developed to overcome the above-mentioned drawbacks of conventional dry developing methods. It is, therefore, an object of the present invention to provided a new and improved dry developing method having satisfactory machining accuracy and efficiency.

To achieve the aforementioned object in accordance with the present invention, there is provided a dry developing method for patterning a resist formed on a processing object by supplying a processing gas in a vacuum processing container and forming plasma of the processing gas by applying a high frequency power, wherein the resist has a first resist layer containing silicon and having a pattern formed therein and a second resist layer provided beneath the first resist layer, and the second resist layer is plasma processed by a first step using a gaseous mixture of carbon monoxide gas and an oxygen gas. In accordance with this configuration, silicon contained in a surface of the silicon-containing first resist layer is oxidized and the first resist layer can be prevented from being destroyed during a developing process.

The dry developing method may further include, after the first step, a second step in which a further plasma processing is carried out by using a gaseous mixture of a nitrogen gas and a hydrogen gas. In accordance with this configuration, it is possible to avoid an undercut or a bowing of the second resist layer and form a vertical pattern with high accuracy.

In the first step, it is preferable that an etching rate ratio of the second resist layer to the first resist layer during a plasma process is greater than or equal to 10. Such a condition can be achieved by setting a flow rate ratio of the carbon monoxide gas to the oxygen gas to range from 0.2 to 5; an applied high frequency power density to range from 0.32 W/cm$^2$ to 3.18 W/cm$^2$; and a temperature of a susceptor, for mounting thereon the processing object, of a lower electrode to which the high frequency power is applied to range from −30° C. to 20° C.

In the first step, an undercut is formed around a top portion of the second resist layer and, in the second step, a pattern having an approximately equal size to that of the first resist layer is formed at a lower portion of the second resist layer. The undercut can be controlled in the first step by a processing time, a flow rate ratio between the carbon monoxide gas and the oxygen gas and the high frequency power applied to the lower electrode. Further, a trimming of the pattern can be performed by the first and the second step.

The first resist layer is thicker than a total thickness of the first resist layer etched by the first and the second step, thereby preventing the first resist layer from being locally removed completely during the second step. In the dry developing method described above the plasma can be formed between parallel flat electrodes installed in a vacuum processing container. In accordance with the above configuration, a destruction of the first resist layer can be prevented and, further, it is possible to perform a dry developing method having an improved etching rate of the second resist layer with high accuracy and efficiency.

DETAILED DESCRIPTION OF THE PREFERRED EMBODIMENTS

Figure 1:
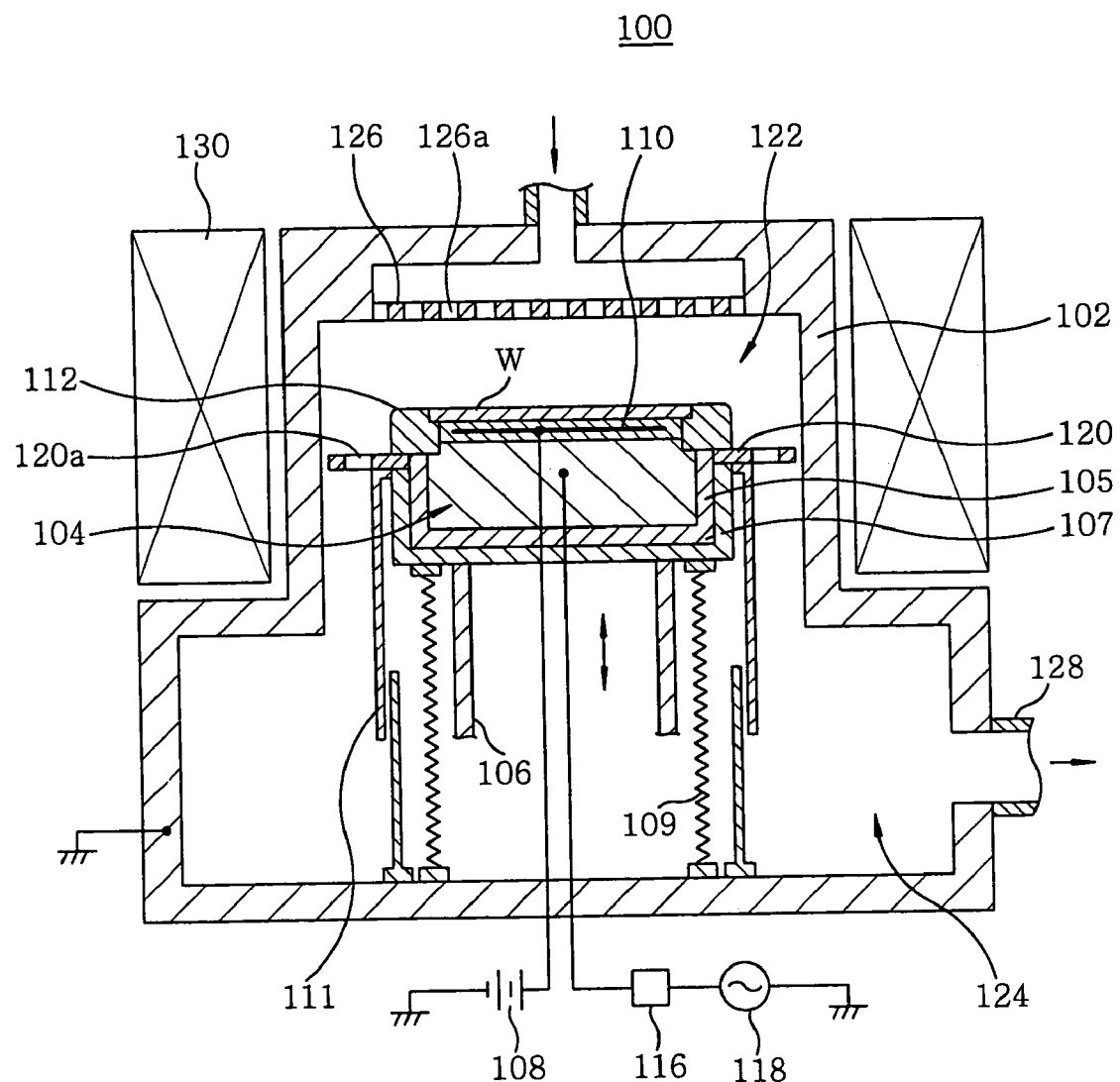
FIG. 1 shows a schematic cross sectional view of an etching apparatus in accordance with the present invention.

Hereinafter, preferred embodiments of the dry developing method in accordance with the present invention will be described in detail with reference to the accompanying drawings. Further, in the specification and the accompanying drawings, like reference numerals will be given to like parts having substantially the same functions, and redundant description thereof will be omitted.

First, an overall arrangement of an etching apparatus 100 to which the present invention can be applied will be described in detail with reference to FIG. 1. A processing container 102 of the etching apparatus 100 illustrated in FIG. 1 is grounded and made of aluminum, having a surface coated with an aluminum oxide film layer by performing, e.g., an anodizing process.

Disposed inside the processing container 102 is a lower electrode 104 also serving as a susceptor for mounting thereon a processing object, e.g., a semiconductor wafer W (hereinafter, referred to as "wafer"). Further, in the example shown in FIG. 1, portions other than a mounting surface of the lower electrode 104 are covered with an insulating member 105 made of, e.g., ceramic, and a conductive member 107 made of, e.g., aluminum.

The lower electrode 104 is vertically movable by an operation of an elevating column 106. Furthermore, bellows 109 made of, e.g., stainless steel, are installed between the conductive member 107 and the processing container 102.

An aluminum oxide film layer is removed from parts of surfaces of the conductive member 107 and the processing container 102, which are electrically in contact with bellows 109, and, thus, enabling the conductive member 107 to be grounded via the bellows 109 and the processing container 102. Moreover, a bellows cover 111 is installed to surround a side surface of the conductive member 107 and bellows 109.

As shown in FIG. 1, an electrostatic chuck 110 connected to a high voltage DC power supply 108 is installed at the mounting surface of the lower electrode 104 and, moreover, an insulating focus ring 112 is provided to surround the electrostatic chuck 110.

The lower electrode 104 is connected to a high frequency power supply 118 outputting a high frequency power via a matching unit 116. An exhaust ring 120 is disposed at a side portion of the lower electrode 104. In the illustrated example, the exhaust ring 120 is inserted between the focus ring 112 and the conductive member 107, while being fixed at a top portion of the conductive member 107 by conductive screws (not shown).

Since the exhaust ring 120 is grounded via the conductive member 107, the bellows 109, and the processing container 102, the exhaust ring 120 and an inner wall of the processing container 102 can have an approximately equal electric potential (ground potential). Consequently, the exhaust ring 120 and an upper portion of the inner wall of the processing container 102 that is above the exhaust ring 120 function as counterpart electrodes, so that a plasma can be trapped in an upper portion of the exhaust ring 120, i.e., a processing space 122 to be described below.

An upper electrode 126 is installed on an inner wall surface of the processing container 102, which faces the mounting surface of the lower electrode 104. Further, a plurality of gas inlet holes 126a that are connected to a gas supply source (not shown) for supplying a processing gas, are provided at the upper electrode 126. Thus, the processing gas is supplied into the processing space 122 through the gas inlet holes 126a.

An exhaust line 128 connected to a vacuum device (not shown) is provided at a lower portion of the processing container 102. Therefore, an inner space of the processing container 122 is evacuated via slits 120a of the exhaust ring 120, an exhaust channel 124 and the exhaust line 128. Further, there is provided a magnet 130 disposed outside the processing container 102 to surround a plasma area formed between the lower electrode 104 and the upper electrode 126.

Figure 2:
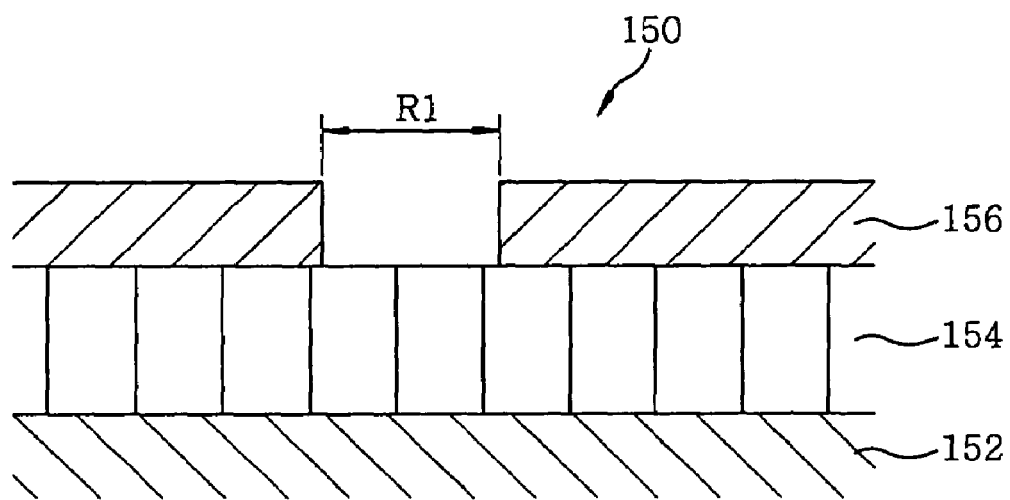
FIG. 2 illustrates a schematic cross sectional view of a processing object before being drydeveloped.

In the following, a resist used in carrying out a dry developing method in accordance with the embodiment and etching conditions therefor will be described in detail. FIG. 2 depicts a schematic cross sectional view of a processing object 150 before the dry development thereof. As for the object to be processed, a wafer W made of silicon having a diameter of, e.g., 200 mm, is used.

As illustrated in FIG. 2, a silicon-containing resist layer (hereinafter, referred to as "upper layer resist") 156 having a pattern formed by, e.g., a wet process, is provided on a surface. A method of forming the silicon-containing upper layer resist 156 includes, e.g., a method of patterning a previously formed silicon-containing resist film; and a method of patterning a resist film formed of widely used resist materials and then silylating a surface thereof.

In the former method, i.e., the method of patterning an already formed silicon-containing resist film, materials of resist films can be, e.g., a positive resist obtained by chemically adhering a photoactive dimazo compound to aqueous base soluble polysilsesquioxane; a positive resist obtained by chemically adhering acid-susceptible t-butyloxylcarbonyl to aqueous base soluble polysilsesquiozane; a negative resist obtained by chemically adhering an azido functional group to aqueous base soluble polysilsesquioxane; a negative resist including aqueous base soluble silicon-containing polymer having phenolic group, a crosslinking agent and an acid generator; and the like.

In the latter method, i.e., the method of patterning a typical resist film and then silylating a surface thereof, a silylation method includes, e.g., a method in which a resist film is exposed to a gas atmosphere including hexamethyldisilazane or tetramethyldisilazane as a silylating agent, and a method in which a resist film is exposed to a plasma of a silicon-containing gas such as silane, disilane, dichlorosilane, and the like.

A thickness of the upper layer resist 156 is chosen to be, e.g., 250 nm, to ensure that none of the parts are completely removed locally after the dry development, whereas a width R1 of a pattern is chosen to be, e.g., 150 nm.

Formed under the upper layer resist 156 is a lower layer resist 154 to be developed by using the dry developing method in accordance with the present invention. The lower layer resist 154 can be made of a typical resist material having as a main component thereof, e.g., phenol novolak resin, cresol novolak resin, 1-methoxy-2-propanol and the like. A thickness of the lower layer resist 154 is, e.g., 820 nm.

Furthermore, an etching layer 152, e.g., a silicon oxide film ($SiO_2$ film), is formed beneath the lower layer resist 154. The etching layer 152 can also be, e.g., an Al film or the like for metal wiring.

The dry developing method in accordance with the present invention has two steps. A first step is performed by using a gaseous mixture of a carbon monoxide gas and an oxygen gas to ensure that a surface of the upper layer resist 156 is oxidized to form a silicon oxide film, thereby preventing the upper layer resist 156 from being damaged during a second step.

The following etching conditions were applied to the first step: a vacuum level in the processing container 102 of 15 mT; a processing gas of a gaseous mixture of a CO gas and an $O_2$ gas respectively having a flow rate of 60 sccm; a temperature of the inner wall surface of the processing container 102 including the upper electrode 126 controlled at 60° C.; a temperature of the mounting surface of the lower electrode 104 controlled at 0° C.; a distance of 27 mm between the upper electrode 126 and the lower electrode 104; a pressure of a cooling gas on a backside of a center of a wafer at 7 Torr; a pressure of a cooling gas on a backside of a wafer edge at 40 Torr; a high frequency power of 240 W (0.76 W/cm$^2$) applied to the lower electrode 104; and a processing time of 30 seconds.

Since a bowing or an undercut is likely to occur during the first step, a processing time is shortened in a controlled manner such that during the processing time a surface of the upper layer resist 156 is oxidized to form a silicon oxide film and further an appropriate undercut is formed at the lower layer resist 154. Since the formation of the undercut proportionally varies with an amount of processing time, the amount of undercutting can be controlled by adjusting the processing time and the like. In addition, the upper layer resist 156 is prevented from being damaged during the first and the second step by adjusting a high frequency power, a temperature condition of the mounting surface, and a $CO/O_2$ mixing ratio which increases a ratio of etching rates (hereinafter, referred to as etching selectivity) of the upper layer resist 156 and the lower layer resist 154. The undercut mentioned above refers to a horizontal etching of the lower layer resist 154 near an interface of the lower layer resist 154 and the upper layer resist 154. The bowing refers to an etching of the lower layer resist 154 in a shape of a beer keg.

The second step is carried out by using a gaseous mixture of a nitrogen gas and a hydrogen gas. By using such gaseous mixture, a highly anisotropic etching can be performed, but an etched width tends to be slightly narrower than that of the pattern. Moreover, as described in the description of the prior art, in using such gaseous mixture, the etching selectivity between the upper layer resist 156 and the lower layer resist 154 tends to be poor, and the upper layer resist 156 gets damaged.

However, in accordance with the dry developing method of the preferred embodiment, silicon contained in the surface of the upper layer resist 156 is oxidized in the first step, thereby improving the etching selectivity. Further, a formation of a small undercut in the first step, combined with a narrower etched width in the second step, enables an accurate etching according to a pattern of the upper layer resist 156.

The following etching conditions were applied to the second step: vacuum level in the processing container 102 of 70 mT; a processing gas of a gaseous mixture of a $N_2$ gas and a $H_2$ gas each having a flow rate of 200 sccm; a temperature of the inner wall surface of the processing container 102 including the upper electrode 126 controlled at 60° C.; a temperature of the mounting surface of the lower electrode 104 controlled at 0° C.; a distance of 47 nm between the upper electrode 126 and the lower electrode 104; a pressure of a cooling gas on the backside at the center of the wafer centerat 7 Torr; a pressure of a cooling gas on the backside at the wafer edge at 40 Torr; a high frequency power of 1000 W (3.18 W/cm$^2$) applied to the lower electrode 104; and a processing time of 90 seconds.

In the second step, a highly anisotropic etching, yielding a width slightly narrower than that of the pattern, is performed. However, due to the formation of small undercut in the first step, the etching can be performed according to the pattern width of the upper layer resist 156. Moreover, the etching selectivity is improved by oxidizing silicon contained in the surface of the upper layer resist 156, which in turn enables the lower layer resist 154 to be effectively etched.

Table 1 shows a comparison of etching results in accordance with different dry developing methods including: the method 1 of performing a single process by using a gaseous mixture of carbon monoxide gas and oxygen gas; the method 2 of performing a single process by using a gaseous mixture of nitrogen gas and hydrogen gas; a method 3 of executing two-step process including the first and the second step.

TABLE 1

|  | Method 1 | Method 2 | Method 3 | |
| --- | --- | --- | --- | --- |
|  | $CO + O_2$ | $N_2 + H_2$ | First step | Second step |
| Lower layer E/R (nm/min.) | 267 | 532 | 460 | 515 |
| Upper layer E/R (nm/min.) | 5 | 137 | 25 | 75 |
| Selectivity | 53.5 | 3.9 | 18.4 | 6.9 |
| CD bias (nm) | 50 | −75 | −32 | |

Figure 3:
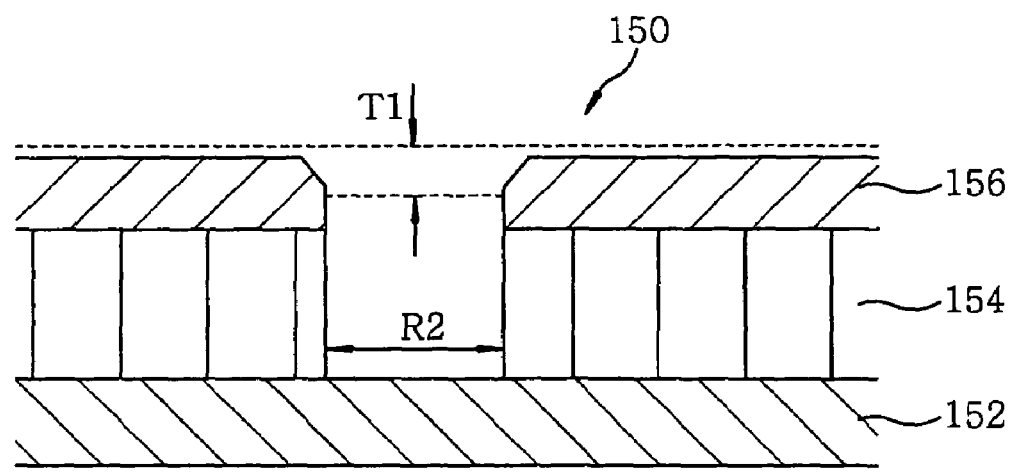
FIG. 3 depicts a schematic cross sectional view of the processing object after being drydeveloped.
Figure 4A:
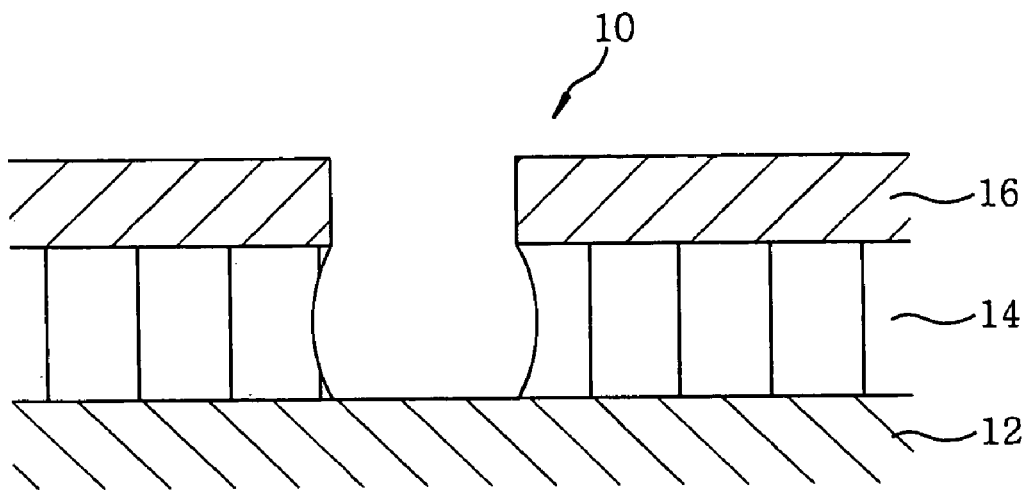
FIG. 4 describes a schematic cross sectional view of a processing object after being dry-developed by using a conventional method.
Figure 4B:
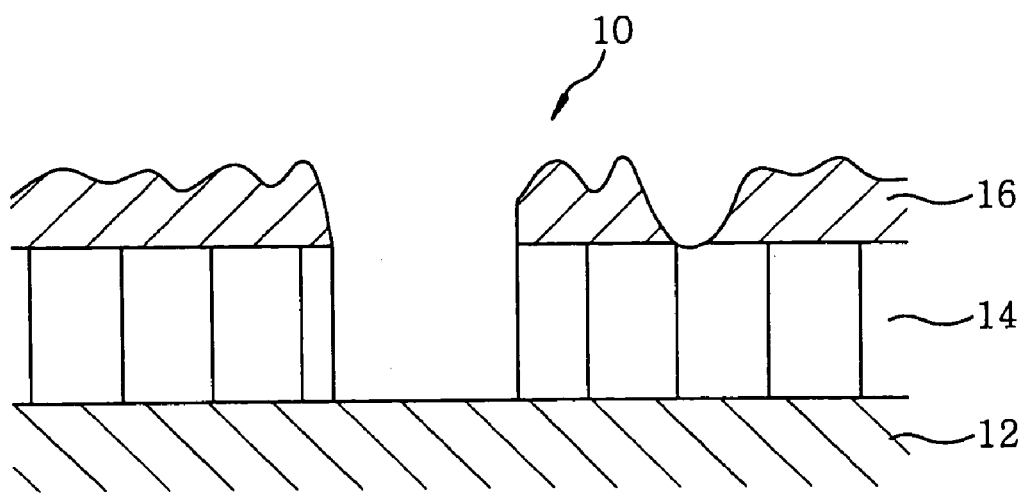

Herein, E/R indicates an etching rate in nanometer/minute. Since corner portions of the upper layer resist 156 are etched more relative to other portions, the upper layer E/R represents the amount of thickness T1 (illustrated in FIG. 3) etched per unit time. The selectivity is a ratio of the upper layer E/R and the lower layer E/R. All of these are obtained in a direction of a short axis of an etched pattern (an oval shaped hole) of a wafer center portion. The CD bias, which is a value obtained by subtracting a pattern width (R1 of FIG. 2) of the upper layer resist before the etching from that (R2 of FIG. 3) of a lower portion of the lower layer resist 154 after the etching, represents a change in pattern width. In the present invention, the CD bias is −32 nm, representing a slight reduction in line-width.

The etching conditions of the method 1 are as follows: first, in order to ignite a plasma, the following process were performed. That is, a vacuum level in the processing container 102 was established at 30 mT. A processing gas used was a gaseous mixture of CO gas and $O_2$ gas having a respective flow rate of 60 sccm. A temperature of the inner wall surface of the processing container 102 including the upper electrode 126 was controlled at 60° C. and a temperature of the mounting surface of the lower electrode 104 was controlled at −20° C. A high frequency power of 300 W (0.96 W/cm$^2$) was applied to the lower electrode 104 and a processing time was 3 seconds.

Thereafter, the etching was performed under the following conditions: a vacuum level in the processing container 102 of 15 mT; a processing gas having a gaseous mixture of CO gas and $O_2$ gas having a respective flow rate of 60 sccm; a temperature of the inner wall surface of the processing container 102 including the upper electrode 126 controlled at 60° C.; a temperature of the mounting surface of the lower electrode 104 controlled at −20° C.; a distance of 27 mm between the upper electrode 126 and the lower electrode 104; a high frequency power of 120 W (0.38 W/cm$^2$) applied to the lower electrode 104; and a processing time of 273 seconds. A rather large selectivity of 53.5 and CD bias of 50 nm can be observed as well as a large undercut.

The following conditions were applied to the etching in accordance with the method 2: a vacuum level in the processing container 102 of 70 mT; a processing gas a gaseous mixture of $N_2$ gas and $H_2$ gas having a respective flow rate of 200 sccm ; a temperature of the inner wall surface of the processing container 102 including the upper electrode 126 controlled at 60° C.; a temperature of the mounting surface of the lower electrode 104 controlled at −20° C.; a distance of 47 nm between the upper electrode 126 and the lower electrode 104; a high frequency power of 1000 W applied to the lower electrode 104; and a processing time of 210 seconds. A rather small selectivity of 3.9 and the CD bias of −75 nm can be observed as well as a smaller etched pattern width.

The first step of the method 3 has main purposes of oxidizing silicon contained in a silicon-containing upper layer resist and generating a proper undercut, and can be performed in a short period of time. Since the silicon contained in a surface of the upper layer resist 156 is oxidized in the first step of the method 3, a $SiO_2$ film formed at the surface of the upper layer resist 156 serves as a protective layer and, therefore, the etching selectivity of the second step, i.e., 6.9, is improved in comparison with that of the method 2, i.e., 3.9. Furthermore, due to a formation of an appropriate amount of undercut in the first step of the method 3, combined with a narrower etched pattern width in the second step, etching can be performed according to the pattern width of the resist.

Hereinafter, processing conditions of the method 1 and those of the first step of the method 3 will be examined in detail. Table 2 illustrates an etching result obtained by changing a flow rate ratio between the carbon monoxide gas and the oxygen gas. After performing a plasma ignition process under the same conditions as in the method 1, the etching was carried out under the following conditions: a temperature of the inner wall surface of the processing container 102 including the upper electrode 126 controlled at 60° C.; a temperature of the mounting surface of the lower electrode 104 controlled at −20° C.; a distance of 27 mm between the upper electrode 126 to the lower electrode 104; a high frequency power of 120 W (0.38 W/cm$^2$) applied to the lower electrode 104; and a processing time of 273 seconds, while a gaseous mixture of CO gas and $O_2$ gas having varying flow rates of 60/60, 80/40 and 100/20 sccm/sccm was used as a processing gas under a vacuum level of 15 mT in the processing container 102.

TABLE 2

|  | CO/$O_2$ flow ratio (sccm/sccm) | | |
| --- | --- | --- | --- |
|  | 60/60 | 80/40 | 100/20 |
| Lower layer E/R (nm/min.) | 267 | 222 | 175 |
| Upper layer E/R (nm/min.) | 5 | 7 | 12 |
| Selectivity | 53.5 | 30.0 | 14.0 |

As shown in Table 2, all the etching selectivities are greater than or equal to 10 under the above conditions. The conditions of the above flow rate ratios of the gaseous mixture can be applied to the method 1 and the first step of the method 3. However, as the CO/$O_2$ flow rate ratio increases, the selectivity and the etching rate are decreased. Thus, it is preferable to set the CO/$O_2$ flow rate ratio to be smaller than or equal to 100/20, i.e., 5. Meanwhile, as the CO/$O_2$ flow rate ratio decreases, the selectivity and the etching rate increase, while an undercut tends to be larger. Accordingly, the CO/$O_2$ flow rate ratio is preferably greater than or equal to 20/100, i.e., 0.2 and, more preferably, 60/60, i.e., 1.0.

In the following, the conditions for a high frequency power will be examined. After performing the plasma ignition process under the same conditions as in the method 1, the etching was carried out under the following conditions: a processing gas of a gaseous mixture of CO gas and $O_2$ gas of 60/60 (sccm/sccm) under a vacuum level of 15 mT in the processing container 102; a temperature of the inner wall surface of the processing container 102 including the upper electrode 126 controlled at 60° C.; a temperature of the mounting surface of the lower electrode 104 controlled at −20° C.; and a distance of 27 mm between the upper electrode 126 and the lower electrode 104. Under such conditions, a high frequency powers of 120 W, 240 W and 360 W were applied to the lower electrode 104, and by taking into account the etching rate a processing time was chosen to yield an equal amount of etching (over-etching rate). Results obtained by varying the applied high frequency power is given in Table 3.

TABLE 3

|  | High frequency power (W) | | |
| --- | --- | --- | --- |
|  | 120 | 240 | 360 |
| Lower layer E/R (nm/min.) | 267 | 480 | 625 |
| Upper layer E/R (nm/min.) | 5 | 25 | 32 |
| Selectivity | 53.5 | 19.2 | 19.2 |

As shown in Table 3, all of the etching selectivities are greater than or equal to 10 under the above conditions. The above conditions of the high frequency power can be applied to the method 1 and the first step of the method 3. As the high frequency power increases, a drawing energy of ion increases, and as a result an increase in etching rate can be seen, as well as well as an increase in anisotropy of an etching shape, however with that the selectivity tends to decline. Accordingly, the high frequency power is preferably chosen to be smaller than or equal to about 1000 W (3.18 W/cm$^2$) and, more preferably about 400 W (1.27 W/cm$^2$) As the high frequency power decreases, the etching rate declines, while the selectivity increases, however, with that the anisotropy is slightly reduced and an undercut tends to be larger, and thus the high frequency power is preferably chosen to be greater than or equal to about 100 W (0.32 W/cm$^2$).

Hereinafter, a various temperature conditions of the mounting surface of the lower electrode 104 will be examined. After performing the plasma ignition process under the same conditions as the method 1, the etching was carried out under the following conditions: a processing gas having a gaseous mixture of CO gas and $O_2$ gas having a flow rate ratio of 80/40 (sccm/sccm) under a vacuum level of 15 mT in the processing container 102; a distance of 27 mm between the upper electrode 126 and the lower electrode 104; a high frequency power of 120 W applied to the lower electrode 104; and by taking into account an etching rate a processing time was chosen to yield an equal amount of etching (over etching rate). Under such conditions, a temperature of the inner wall surface of the processing container 102 including the upper electrode 126 was controlled at 60° C.; and a temperature of the mounting surface of the lower electrode 104 was controlled at –20 and 0° C., respectively. Table 4 illustrates a result obtained by treating the temperature of the mounting surface of the lower electrode 104 as a variable.

TABLE 4

|  | Temperature of lower electrode (° C.) | |
| --- | --- | --- |
|  | 0 | –20 |
| Lower layer E/R (nm/min.) | 205 | 230 |
| Upper layer E/R (nm/min.) | 12 | 10 |
| Selectivity | 16.4 | 23.0 |

As shown in Table 4, all of the etching selectivities are greater than or equal to 10 under the above conditions. The conditions of the temperature of the lower electrode can be applied to the method 1 and the first step of the method 3. However, an increase in the temperature of the mounting surface of the lower electrode reduces a deposition, which causes a reduction in selectivity. And also, the anisotropy is slightly deteriorated, so that the undercut tends to be larger. Accordingly, it is preferable that the temperature of the mounting surface of the lower electrode ranges from about –30° C. to 20° C. and, more preferably smaller than or equal to about 0° C.

Based on the above results, an appropriate undercut is formed near a top portion of the lower layer resist 154 in the method 1 and the first step of the method 3, and the etching can be performed according to the pattern of the upper layer resist 156 in the second step of the method 3 under the following preferable conditions: a flow rate ratio of carbon monoxide gas and oxygen gas ranging from about 0.2 to 5; a high frequency power density applied to the lower electrode ranging from about 120 W (0.32 W/cm$^2$) to 1000 W (3.18 W/cm2); and a temperature of the susceptor, for mounting thereon the processing object, of the lower electrode to which the high frequency power is applied ranging from about –30° C. to 20° C.

In accordance with the dry developing method of the present invention, such method provides a satisfactory etching efficiency while maintaining a vertical sidewall of a pattern formed on a resist. Further, in the present invention, a trimming for controlling a lower pattern width (R2 in FIG. 3) of the lower layer resist 154, which is obtained after the second step, can be performed by changing the CO/O$_2$ flow rate ratio, the high frequency power applied to the lower electrode, the temperature of the lower electrode and the processing time of the first step of the method 3.

While the preferred embodiments of the dry developing method in accordance with the invention have been shown and described with reference to the accompanying drawings, it will be understood by those skilled in the art that various changes and modifications may be made without departing from the spirit and scope of the invention.

Etching conditions and a thickness of a resist film, for example, vary depending on devices and, therefore, they are not limited to the aforementioned examples. Such conditions should be determined depending on devices so as to obtain the same effects.

INDUSTRIAL APPLICABILITY

The present invention is applied to a dry developing method for etching a lower layer resist of a double-layer resist with a high degree of accuracy without destroying an upper layer resist while maintaining a vertical sidewall of a pattern being etched.

What is claimed is:

1. A dry developing method for patterning a resist formed on a processing object, wherein the resist has a patterned first resist layer containing silicon and a second resist layer provided beneath the first resist layer, the method comprising the steps of:

(a) performing a first plasma process on the resist by using a first gaseous mixture of a carbon monoxide gas and an oxygen gas, wherein a surface of the first resist layer is oxidized and a top portion of the second resist layer is etched during the first plasma process; and then (b) performing a second plasma process on the second resist layer by using a second gaseous mixture, wherein a composition of the second gaseous mixture differs from that of the first gaseous mixture wherein the second gaseous mixture includes a nitrogen gas and a hydrogen gas.

2. The dry developing method of claim 1, wherein an etching rate ratio of the second resist layer to the first resist layer during the first plasma process is greater than or equal to 10.

3. The dry developing method of claim 2, wherein a flow rate ratio of the carbon monoxide gas to the oxygen gas in step (a) ranges from 0.2 to 5.

4. The dry developing method of claim 2, wherein a high frequency power density applied in step (a) ranges from 0.32 W/cm$^2$ to 3.18 W/cm$^2$.

5. The dry developing method of claim 2, wherein, in step (a), a temperature of a susceptor, mounting thereon the processing object, of a lower electrode to which the high frequency power is applied ranges from –30° C. to 20° C.

6. The dry developing method of claim 1, wherein an undercut is formed around the etched top portion of the second resist layer in step (a), and a pattern having an approximately equal size to that of the first resist layer is formed at a lower portion of the second resist layer in step (b).

7. The dry developing method of claim 6, wherein the undercut of step (a) is controlled by a processing time.

8. The dry developing method of claim 6, wherein the undercut of step (a) is controlled by a flow rate ratio between the carbon monoxide gas and the oxygen gas in step (a).

9. The dry developing method of claim 6, wherein the undercut of step (a) is controlled by a high frequency power applied to a lower electrode.

10. The dry developing method of claim 1, wherein a trimming of the pattern is performed by steps (a) and (b).

11. The dry developing method of claim 1, wherein a thickness of the first resist layer is greater than a total thickness of the first resist layer etched in steps (a) and (b).

12. The dry developing method of claim 1, wherein the plasma is formed between parallel flat electrodes installed in a vacuum processing container.

13. The dry developing method of claim 1, wherein a silicon oxide film is formed by oxidizing the surface of the first resist layer, the silicon oxide film preventing the first resist layer from being damaged during the second plasma process of step (b).

* * * * *